United States Patent [19]

Dreyer et al.

[11] Patent Number: 5,770,890
[45] Date of Patent: Jun. 23, 1998

[54] USING A THERMAL BARRIER TO PROVIDE A HERMETIC SEAL SURFACE ON ALUMINUM NITRIDE SUBSTRATE ELECTRONIC PACKAGES

[75] Inventors: Gary A. Dreyer, Torrance; Alan L. Kovacs, Long Beach, both of Calif.; Kenneth G. Maish, Tucson, Ariz.

[73] Assignee: Raytheon Company, Los Angeles, Calif.

[21] Appl. No.: 806,885

[22] Filed: Feb. 25, 1997

[51] Int. Cl.$^6$ ............................................ H01L 23/10
[52] U.S. Cl. ............................ 257/710; 257/706
[58] Field of Search .................... 257/704, 705, 257/710, 706

[56] References Cited

U.S. PATENT DOCUMENTS

| | | | |
|---|---|---|---|
| 5,109,268 | 4/1992 | Butera | 257/705 |
| 5,155,661 | 10/1992 | Nagesh et al. | 257/705 |
| 5,159,432 | 10/1992 | Ohkubo et al. | 257/705 |
| 5,168,344 | 12/1992 | Ehlert et al. | 257/705 |
| 5,641,713 | 6/1997 | Kyle | 257/704 |

*Primary Examiner*—Mahshid D. Saadat
*Assistant Examiner*—S. V. Clark
*Attorney, Agent, or Firm*—Leonard A. Alkov; Glenn H. Lenzen, Jr.

[57] ABSTRACT

A hermetically sealed microelectronic package that uses a thermal barrier or interposer between a cover and an aluminum nitride substrate. A solder interface is disposed on an aluminum nitride substrate, and the thermal barrier is disposed on the solder interface. The cover is attached to the solder interface using a solder seal that solders the cover to the interposer to produce a hermetically sealed package. The thermal barrier or interposer permits low cost, low temperature soldering of metal covers to metallized aluminum nitride substrate and is compatible with volume production processing.

16 Claims, 1 Drawing Sheet

USING A THERMAL BARRIER TO PROVIDE A HERMETIC SEAL SURFACE ON ALUMINUM NITRIDE SUBSTRATE ELECTRONIC PACKAGES

BACKGROUND

The present invention relates generally to sealing of covers to aluminum nitride substrates, and more particularly, to the use of an interposer for use in sealing covers to aluminum nitride substrates.

A major concern when designing microelectronic or microwave packages is the availability of a reliable method of hermetic sealing the packages after internal components have been installed. Since devices placed in these packages or the mounting materials used for installation of devices often cannot survive high sealing temperatures, production methods of locally heating along the edges of the package covers to reflow solder and effect a seal to the package base have been developed over the years. These have proven to be very effective when sealing metal housings or metallized ceramic (alumina) structures.

Within the last few years, new developments in ceramics resulted in the development of aluminum nitride substrates. This material is of great interest because it possesses very good heat transfer properties and multilayer structures can be commercially produced. This is very desirable when designing dense, high power structures. By utilizing such a ceramic as the base of a package, it would be possible to realize considerable reductions in weight and volume compared to earlier approaches. However, to accomplish this, it is necessary that sealing of the substrate assembly be possible using a reliable, low cost proven method.

To seal this substrate or package, it is necessary to hermetically attach a metal cover to the substrate using a high temperature solder alloy. This is performed after components have been attached to the substrate using solders and adhesives that cannot be heated to the sealing alloy temperature.

Initial sealing studies performed by the assignee of the present invention focused on directly soldering covers to metallized aluminum nitride, but were unsuccessful. These investigations showed that when using localized heating along the edges of the cover to effect a seal, the high thermal conductivity of aluminum nitride prevented consistent and uniform flow of the solder.

A previous attempt reported in the literature (work done by Martin Marietta funded by Wright Laboratory, Air Force Material Command, Wright-Patterson Air Force Base, Ohio, Contract F33615-92-C-1016) involved the brazing of a iron-base alloy (Kovar) ring to aluminum nitride prior to cover sealing. This approach included machining of the ceramic (to provide groves for the Kovar ring) using a braze alloy (that melted at much higher temperatures than the gold/germanium or gold/tin solders used in the present invention) for attaching the Kovar ring followed by final machining and plating operations, This is very expensive and not a low cost production viable approach. A Kovar cover was laser solder sealed to the machined Kovar ring to provide a hermetic seal.

The disadvantages of this prior approach are that very expensive processing is required to prepare the aluminum nitride for the Kovar ring, the use of a high temperature brazing material to attach the Kovar ring, and the additional expense incurred when machining the brazed Kovar ring to its final thickness.

Accordingly, it is an objective of the present invention to provide for the use of an interposer to facilitate sealing of covers to aluminum nitride substrates.

SUMMARY OF THE INVENTION

To meet the above and other objectives, the present invention delays the loss of heat during solder reflow, and uses an "interposer", or thermal barrier, positioned between the cover and the surface of the substrate to which the cover is to be attached. The interposer is typically an alloy of the material comprising the cover. In addition, this thermal barrier provides a solderable surface for attachment of the cover. The presence of the thermal barrier permits low cost, low temperature soldering of metal covers to metallized aluminum nitride substrates and is compatible with volume production processing.

More particularly, the present invention provides for a microelectronic package having a metallized aluminum nitride substrate, a solder interface disposed on the aluminum nitride substrate, a thermal barrier soldered to the interface, a cover, and a solder seal disposed between the cover and the interposer that solders the cover to the interposer to produce a hermetically sealed package.

The solder composition used to attach the interposer to the substrate may be the same solder (gold/tin), or a higher melting point solder (gold/germanium), than the solder used to attach the cover to the interposer. Both solders are in wide commercial use and are readily available.

By using a thin sheet of interposer, such as an alloy of the cover, production screen printing can be used for high volume assembly of components to the substrate area outlined by the interposer. A cover of the same alloy as the interposer can be seam soldered to the interposer.

The present invention thus permits hermetic sealing of low expansion rate metal alloy flat or domed covers to substrates or packages made of aluminum nitride (a low expansion ceramic material having very good thermal conductivity properties). By having this capability, it is possible to design high power multilayer structures that can be directly sealed, rather than being placed in metal containers, as was done previously. This results in a significant decrease in weight and volume. In addition, when building electronic modules based on the utilization of flat (non-cavity) substrates, a decrease in production costs can be realized because screen printing of solder or epoxies for internal device attach is possible.

The advantages of the present invention include low material and processing costs, and compatibility with volume production techniques. The present invention thus provides a low cost approach involving the addition of an interposer that eliminates the high thermal conductivity effect of aluminum nitride while permitting the use of standard high production assembly and sealing methods.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
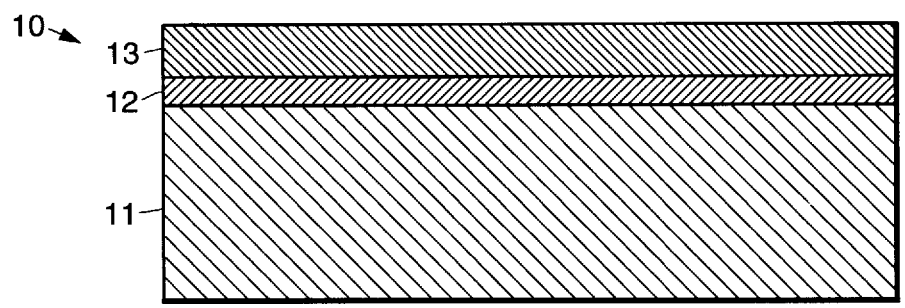
FIGS. 1 and 2 illustrate side and top views, respectively, of a portion of a microelectronic package having an aluminum nitride substrate onto which an interposer in accordance with the principles of the present invention is disposed that permits hermetic sealing of a cover to the substrate.
Figure 2:
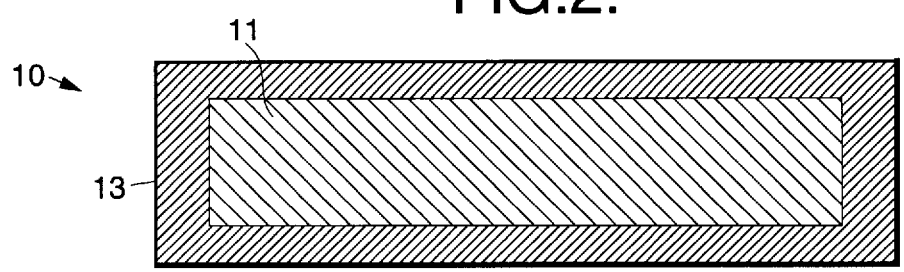

Referring to the drawing figures, FIGS. 1 and 2 illustrate side and top views, respectively, of a portion of a microelectronic package 10 having an aluminum nitride substrate 11 onto which an interposer 13, or thermal barrier 13, in accordance with the principles of the present invention is disposed that permits hermetic sealing of a cover 15 (FIG. 3) to the substrate 11. The substrate 11 is plated with gold and nickel on its exposed top surface. An interface 12 is disposed between the interposer 13 and the aluminum nitride substrate 11. The interface 12 may be comprised of a gold and germanium or gold and tin solder, for example, that interfaces between the interposer 13 and the aluminum nitride substrate 11. The interface 12 is typically on the order of from 0.001 to 0.002 inches thick. The interposer 13 may be made of a gold and nickel plated iron-nickel alloy or Kovar material, for example. The interposer 13 is typically on the order of from 0.002 to 0.005 inches thick. As is shown in FIG. 2, the interposer 13 forms a ring adjacent the periphery of the aluminum nitride substrate 11, thus exposing a center portion of the substrate 11.

Figure 3:
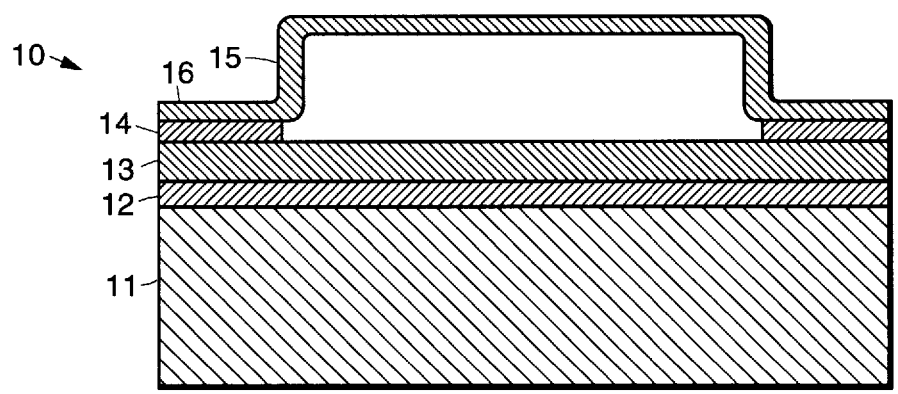
FIG. 3 illustrates a fully fabricated package wherein the cover is successfully hermetic sealed to the substrate because of the thermal impedance characteristic of the present invention.

Referring now to FIG. 3, it illustrates a fully fabricated package 10 wherein a cover 15 is hermetic sealed to the substrate 11 using the interposer 13 of the present invention. A gold-tin solder seal 14 may be used to seam solder the cover 15 to the interposer 13 to produce a hermitic sealed package 10. FIG. 3 illustrates the use of a domed cover 15 which is sealed along a flange 16, but a flat cover may also be used, for example, if the interposer 13 surrounds a cavity in the package 11.

A package 10 has been reduced to practice to test out the principles of the present invention. In the reduced to practice embodiment of the package 10, a thin sheet of iron-nickel alloy having an expansion coefficient very near that of aluminum nitride interposer 13 was soldered to gold/nickel metallized (the interface 12) aluminum nitride ceramic substrate 11 (a material with very good thermal conduction properties) to provide a solderable, heat restricting thermal barrier 13. This permits the design of multilayer ceramic structures in which the multilayer structure can also form the base of the electronic package 10 that can be hermetically sealed using a conventional production process. Significant reductions in product weight, volume and production costs are therefore realized. The thin interposer 13 can vary in thickness from 0.002 to 0.005 inches and is soldered to the gold/nickel metallized surface of the ceramic substrate 11 using conventional low temperature alloys, either 88 gold/12 germanium, 80 gold/20 tin, or 78 gold/22 tin, for example. The interposer 13 may be a readily available low expansion alloy, either alloy 42 (42 iron/58 nickel) or Kovar (53 iron/29 nickel/17 cobalt), for example.

Sealing of the cover 15 to the interposer 13 to effect a hermetic joint is accomplished by soldering the cover flanges 16 to the interposer 13. This can be done using seam soldering, which is a widely available and well known technique.

By using a thin layer of material that forms the interposer 13, conventional high volume production processing methods for the mounting of components utilizing screen printed epoxy or solder can be utilized to fabricate the electronic package 10.

In addition to impeding heat transfer from the solder seal 14 during processing, the interposer 13 also acts as a strain relief member between the cover 15 and ceramic substrate 11, thereby improving the ability of the sealed package 10 to remain hermetic when thermal cycled. A finite element analysis model indicated that the thermally induced stress for a solder seal 14 without a thermal interposer 13 was near 320 mpa (megapascals). This induced stress is on the order of the material strength for the ceramic substrate 11. Although varying solder joint thickness did reduce this induced stress, this still remained too high.

The finite element analysis model included calculations based on the use of thermal interposer thicknesses ranging from 0.001 to 0.010 inches and gold/tin or gold/germanium solder thicknesses of 0.001 to 0.004 inch. Regardless of the selected material thicknesses the thermally induced seal stress was near 90 mpa (approximately a 70 percent reduction).

The interposer 13 was extensively tested. Sample aluminum nitride test substrates 11 with interposers 13 were fabricated and covers 15 soldered to these substrates 11 using localized heating methods. Numerous sealed samples were thermally cycled or thermally shocked to obtain data relating to the ability of the packages 10 to maintain hermeticity following extensive environmental exposures. These results were correlated with metallographic examinations.

The thermal cycling results include up to 400 cycles of exposure to Mil-Std-883, method 1010 (−55 to 125 degrees Celsius) with no loss in hermeticity. In addition, similar samples have been thermally shocked (−65 to 150 degrees Celsius) for up to 2500 cycles with good hermeticity being maintained. Metallographic studies showed good solder flow was consistently obtained, and there was no fracture of the underlying aluminum nitride substrate 11. Also, solder stenciling evaluations were completed showing that this high volume production technique could be utilized when the interposer 13 was used to seal the cover 15 to the substrate 11.

Consistency of cover attach was also demonstrated. A very low sealing yield was obtained when there was no interposer 13, a high sealing yield resulted when the interposer 13 was present, and sealing was accomplished over a wide range of sealing temperatures.

Thus, the use of an interposer for sealing aluminum nitride substrates has been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A microelectronic package comprising:
a metallized aluminum nitride substrate;
a solder interface, comprising gold and germanium solder, disposed on the metallized aluminum nitride substrate;
a thermal barrier interposer soldered to the interface;
a cover; and
a solder seal disposed between the cover and the interposer that solders the cover to the interposer to produce a hermetically sealed package.

2. A microelectronic package comprising:
a metallized aluminum nitride substrate;
a solder interface, comprising gold and tin solder, disposed on the metallized aluminum nitride substrate;
a thermal barrier interposer soldered to the interface;
a cover; and
a solder seal disposed between the cover and the interposer that solders the cover to the interposer to produce a hermetically sealed package.

3. A microelectronic package comprising:

a metallized aluminum nitride substrate;

a solder interface disposed on the metallized aluminum nitride substrate;

a thermal barrier interposer, comprising gold and nickel plated alloy material, soldered to the interface;

a cover; and a solder seal disposed between the cover and the interposer that solders the cover to the interposer to produce a hermetically sealed package.

4. A microelectronic package comprising:

a metallized aluminum nitride substrate;

a solder interface disposed on the metallized aluminum nitride substrate;

a thermal barrier interposer, comprising gold and nickel plated Kovar material, soldered to the interface;

a cover; and a solder seal disposed between the cover and the interposer that solders the cover to the interposer to produce a hermetically sealed package.

5. A microelectronic package comprising:

a metallized aluminum nitride substrate;

a solder interface disposed on the metallized aluminum nitride substrate;

a thermal barrier interposer soldered to the interface;

a cover; and a solder seal disposed between the cover and the interposer that solders the cover to the interposer to produce a hermetically sealed package, wherein the interposer has a thickness of from 0.002 to 0.005 inches.

6. A microelectronic package comprising:

a metallized aluminum nitride substrate;

a solder interface disposed on the metallized aluminum nitride substrate;

a thermal barrier interposer soldered to the interface;

a cover; and a solder seal disposed between the cover and the interposer that solders the cover to the interposer to produce a hermetically sealed package, wherein the interposer has a thickness from 0.001 to 0.002 inches.

7. A microelectronic package comprising:

a metallized aluminum nitride substrate;

a solder interface disposed on the metallized aluminum nitride substrate, wherein the substrate is plated with a gold and nickel solder adjacent to the interface;

a thermal barrier interposer soldered to the interface;

a cover; and a solder seal disposed between the cover and the interposer that solders the cover to the interposer to produce a hermetically sealed package.

8. A microelectronic package comprising:

a metallized aluminum nitride substrate;

a solder interface disposed on the metallized aluminum nitride substrate;

a thermal barrier interposer soldered to the interface;

a cover; and a solder seal, comprising 80 gold/20 tin solder, disposed between the cover and the interposer that solders the cover to the interposer to produce a hermetically sealed package.

9. A microelectronic package comprising:

a metallized aluminum nitride substrate;

a solder interface disposed on the metallized aluminum nitride substrate;

a thermal barrier interposer soldered to the interface;

a cover; and a solder seal, comprising 78 gold/22 tin solder, disposed between the cover and the interposer that solders the cover to the interposer to produce a hermetically sealed package.

10. A microelectronic package comprising:

a metallized aluminum nitride substrate;

a solder interface disposed on the metallized aluminum nitride substrate;

a thermal barrier interposer soldered to the interface;

a cover; and a solder seal disposed between the cover and the interposer that solders the cover to the interposer to produce a hermetically sealed package, wherein the interposer comprises a thin sheet of iron-nickel alloy material.

11. A microelectronic package comprising:

a metallized aluminum nitride substrate;

a solder interface disposed on the metallized aluminum nitride substrate;

a thermal barrier interposer soldered to the interface;

a cover; and a solder seal disposed between the cover and the interposer that solders the cover to the interposer to produce a hermetically sealed package, wherein the interposer is soldered to the gold/nickel metallized surface of the ceramic substrate using a low temperature alloy.

12. The package of claim 10 wherein the iron-nickel alloy material comprises an alloy consisting of 58 percent iron and 42 percent nickel.

13. The package of claim 10 wherein the iron-nickel alloy material comprises an alloy consisting of 53 percent iron, 29 percent nickel, and 17 percent cobalt.

14. The package of claim 11 wherein the low temperature alloy comprises an alloy consisting of 88 percent gold and 12 percent germanium.

15. The package of claim 11 wherein the low temperature alloy comprises an alloy consisting of 80 percent gold and 20 percent tin.

16. The package of claim 11 wherein the low temperature alloy comprises an alloy consisting of 78 percent gold and 22 percent tin.

* * * * *